US007905730B2

(12) United States Patent
Sakamoto et al.

(10) Patent No.: US 7,905,730 B2
(45) Date of Patent: Mar. 15, 2011

(54) INTERPOSER WITH A PAIR OF CONTACT POINTS

(75) Inventors: Katsuhiko Sakamoto, Kanagawa (JP); Eiichiro Takemasa, Kanagawa (JP)

(73) Assignee: Tyco Electronics Japan G.K., Kanagawa-ken (JP)

( * ) Notice: Subject to any disclaimer, the term of this patent is extended or adjusted under 35 U.S.C. 154(b) by 0 days.

(21) Appl. No.: 12/342,345

(22) Filed: Dec. 23, 2008

(65) Prior Publication Data

US 2009/0170349 A1 Jul. 2, 2009

(30) Foreign Application Priority Data

Dec. 27, 2007 (JP) ................................ 2007-337624

(51) Int. Cl.
*H01R 12/00* (2006.01)
*H05K 1/00* (2006.01)

(52) U.S. Cl. ............................ 439/66; 439/91; 439/591

(58) Field of Classification Search .................... 439/66, 439/91, 591
See application file for complete search history.

(56) References Cited

U.S. PATENT DOCUMENTS

| | | | | |
|---|---|---|---|---|
| 5,397,240 | A * | 3/1995 | Herard | 439/66 |
| 5,573,435 | A * | 11/1996 | Grabbe et al. | 439/862 |
| 5,588,846 | A * | 12/1996 | Irlbeck et al. | 439/66 |
| 5,759,047 | A | 6/1998 | Brodsky et al. | |
| 5,957,703 | A * | 9/1999 | Arai et al. | 439/66 |
| 6,280,207 | B1 * | 8/2001 | Sakata et al. | 439/91 |
| 6,307,159 | B1 | 10/2001 | Soejima et al. | |
| 6,515,496 | B2 | 2/2003 | Felici et al. | |
| 6,672,876 | B1 | 1/2004 | Takekoshi | |
| 6,830,461 | B2 | 12/2004 | Sakamoto et al. | |
| 7,255,574 | B1 * | 8/2007 | Ju | 439/66 |
| 7,614,884 | B2 | 11/2009 | Kuwahara et al. | |
| 7,717,718 | B2 | 5/2010 | Davoine et al. | |
| 7,726,984 | B2 | 6/2010 | Bumb, Jr. et al. | |
| 2001/0016433 | A1 * | 8/2001 | Pieper | 439/66 |
| 2006/0166479 | A1 | 7/2006 | Seo et al. | |
| 2006/0223344 | A1 * | 10/2006 | Ju | 439/66 |

FOREIGN PATENT DOCUMENTS

| | | |
|---|---|---|
| JP | 2006-514289 | 4/2006 |
| WO | 2004-077623 A1 | 9/2004 |

* cited by examiner

*Primary Examiner* — Hae Moon Hyeon
(74) *Attorney, Agent, or Firm* — Barley Snyder LLC

(57) ABSTRACT

A contact has a spring section, and a pair of contact points. The spring section is formed as a single closed loop of material, prepared from Ni alloy. The loop may be subjected to elastic deformation through force. The pair of contact points formed in such way that the contact points project outwardly at positions separated from one another, the contact points positioned by about half way around the loop of the spring section. The pair of contact points capable of meeting with and coming into with terminals.

3 Claims, 10 Drawing Sheets

INTERPOSER WITH A PAIR OF CONTACT POINTS

CROSS-REFERENCE TO RELATED APPLICATIONS

This application claims the benefit of the filing date under 35 U.S.C. §119(a)-(d) of Japanese Patent Application No. 2007-337624, filed Dec. 27, 2007.

FIELD OF THE INVENTION

The present invention relates to a contact that is capable of mating with terminals, such as an electric circuit board and semiconductor bumps, and an interposer having an insulator in which the contact is mounted.

BACKGROUND

Currently, there is a probing test that measures an electric characteristic on two or more semiconductor chips, which are formed on a semiconductor wafer in such a way that a contact may quickly link with a terminal, such as lands or balls arranged on semiconductor chips. These contacts are known, including an electro conductive rubber, a so-called Pogo pin, a stamping spring produced by a die cutting processing, and a ring spring with an electroformed pipe. In the probing test, an interposer has an insulator, in which such contacts are mounted.

U.S. Pat. No. 5,573,435 discloses such a contact, wherein two independent unclosed loops are connected. The loops are prepared through a die cutting process. The proposed contact has a design that allows for high elasticity and low resistance, as well as low self-inductance in the low spring constant.

Moreover, the '435 reference proposes a connection body (contact) formed using a MEMS (Micro Electro Mechanical System) process (refer to Japanese Patent Publication Toku-Hyou 2006-514289, for instance). The contact, proposed by Japanese Patent Publication TokuHyou 2006-514289, has a first contact section where one end meets a semiconductor bump, a connection section that is C shaped and extending continuously from the other end to the one end of the first contact section, a support section that is connected with one end of the connection section and has a convex shape, and a second contact section that is inserted into an electric circuit board and has an O shape extending continuously from one end of the support section. The proposed contact may be prepared using micro processing, such as the MEMS process. Particularly, it is possible to prepare one end of the first contact section through micro processing, the first contact section that meets the semiconductor bump. Preparing the proposed first contact through die cutting section would be difficult to implement.

However, a contact prepared from electro-conductive rubber is inferior in durability. A contact that consists of Pogo-pin and the ring spring is inferior in the contact reliability. Moreover, a contact that consists of the stamping spring is difficult to implement miniaturization, because there is a limit in micro processing, and it is inferior in high density mounting and handling a high-speed signal.

According to the contact proposed by U.S. Pat. No. 5,573,435, two unclosed loops are formed, but are independent of each other. The amount of displacement is relatively small and the contact pressure increases in an interposer where the contact is mounted on the insulator.

It is difficult to minimize the shape of the proposed contact, especially considering that the two independent loops connect. However, it is necessary to reduce the loop in order to achieve maximum displacement and the low contact pressure. Moreover, since the connected structure of two independent loops is a structure joined in the center section, connection might broken when the contact is under a lateral load. Moreover, there is a problem in that the contact is inferior in a high-density mounting and high-speed signal to the insulator, because the contact is the one produced by a die cutting process.

According to the contact proposed by Japanese Patent Publication TokuHyou 2006-514289, an interposer, wherein the contact is mounted on an insulator, the amount of displacement depends only on a cantilever beam of a connection section. Accordingly, it is necessary to increase the thickness of the contact, for instance 100 μm or more, to obtain a large amount of displacement (to obtain a prescribed spring load). However, it is known that it takes a long time to form a contact having a thickness of 100 μm using the MEMS process, as much as 10 hours.

SUMMARY

In view of the foregoing, it is an object of the present invention, among others, to provide a contact which has high durability and reliability, all the while the contact being capable of applying a high-density mounting on the insulator, and also capable of handling high-speed signals.

The contact includes a spring section that is formed as a single closed loop of material, prepared from Ni alloy. The loop may be subjected to force at different points along the loop, to cause elastic deformation. The contact having a pair of contact points, formed in such a way that the contact points project outwardly at positions separated from one another, each contact point positioned about half way around the loop of the spring section. Each contact point capable of meeting with a terminal.

BRIEF DESCRIPTION OF THE DRAWINGS

The invention will be explained in greater detail in the following with reference to embodiments, referring to the appended drawings, in which.

DETAILED DESCRIPTION OF THE DRAWINGS

Embodiment(s)

Embodiments of the present invention will be described with reference to the accompanying drawings.

Figure 1:
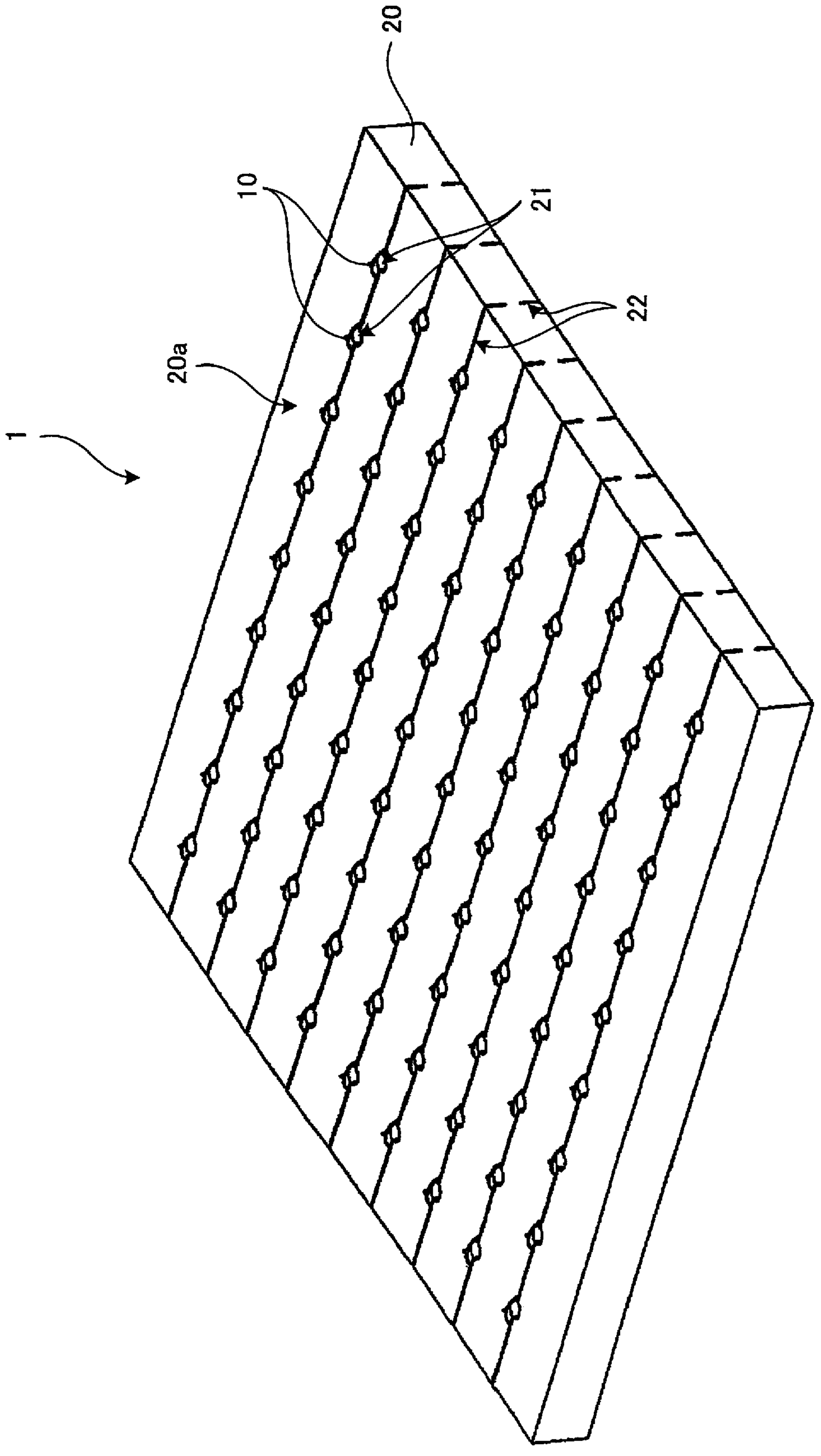
FIG. 1 is a perspective view of an interposer according to a first embodiment of the present invention.
Figure 2:
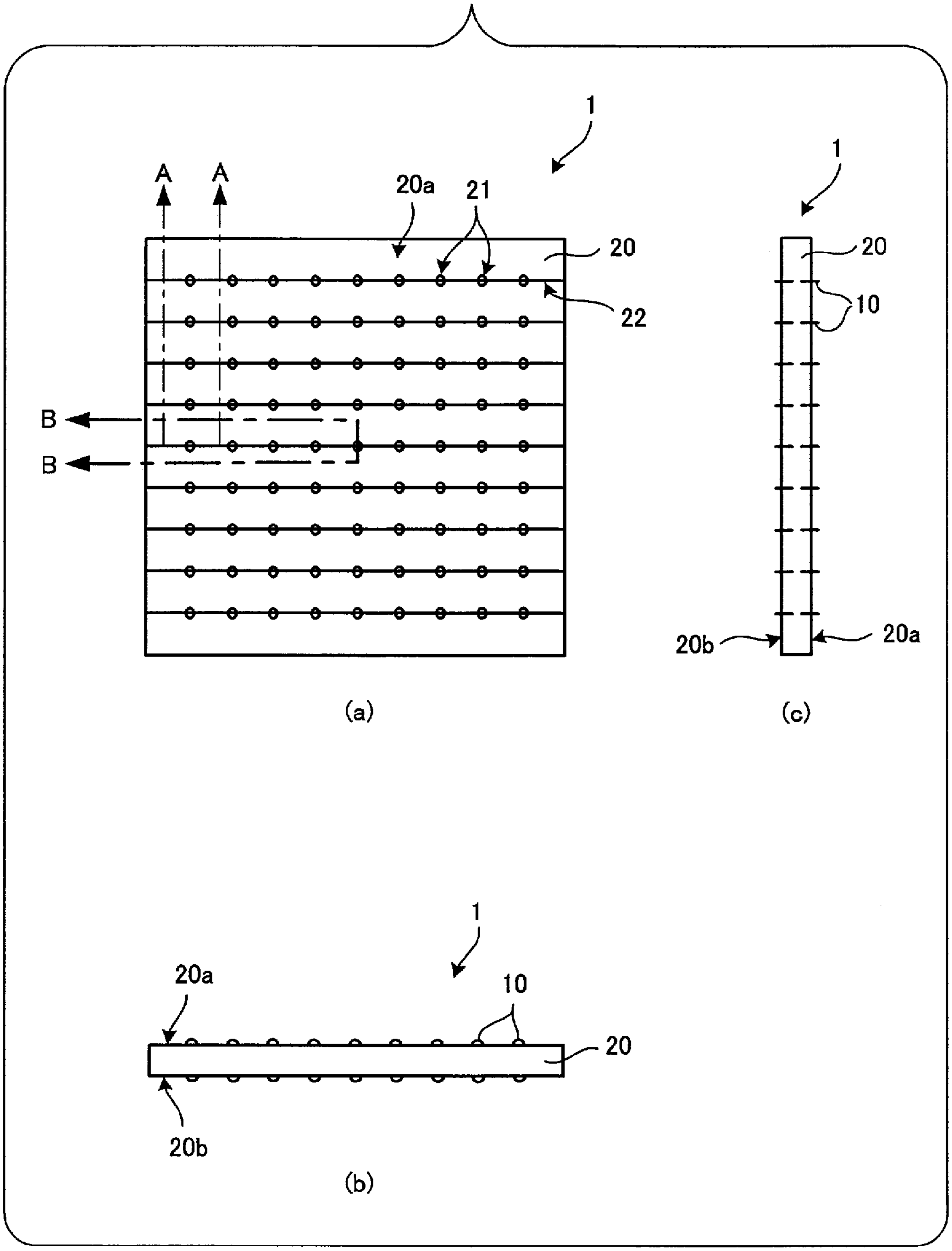
FIG. 2 is a plan view of the interposer according to the first embodiment of the present invention.

FIG. 1 is a perspective view of an interposer according to a first embodiment of the present invention. FIG. 2 is a plan view of the interposer according to the first embodiment of the present invention. A part (a) of FIG. 2 is a plan view. A part (b) of FIG. 2 is a front view. A part (c) of FIG. 2 is a right side view.

Figure 3:
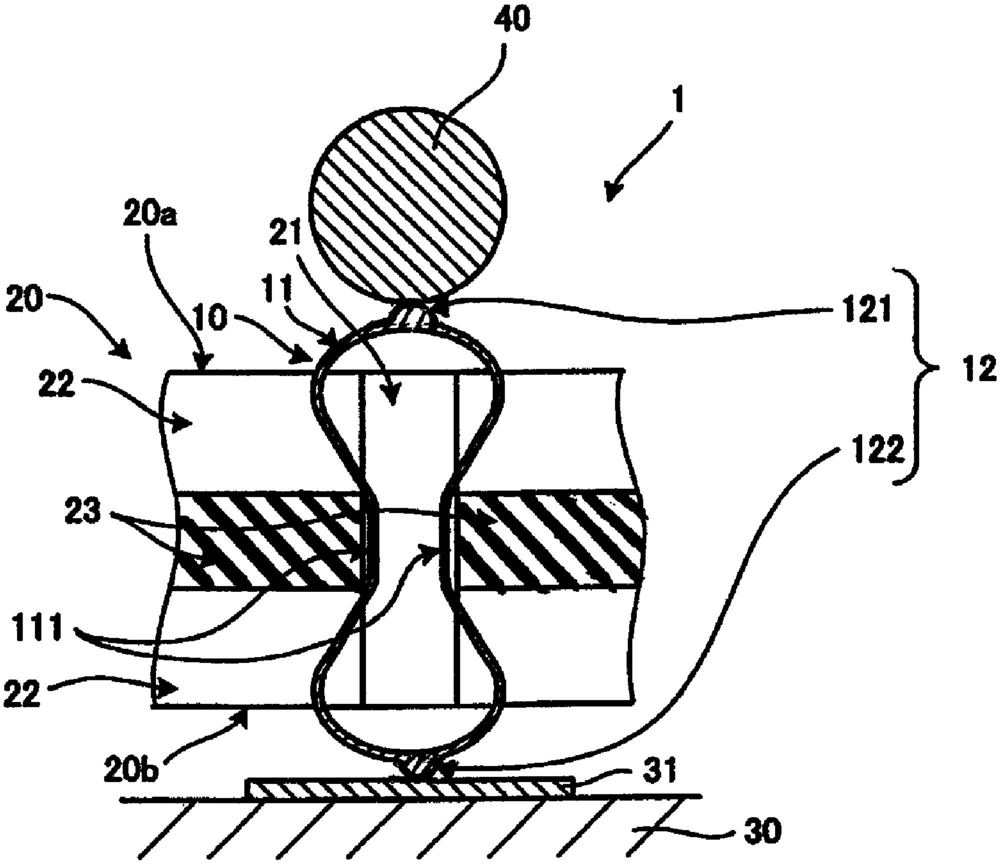
FIG. 3 is a front view of the interposer according to the first embodiment of the present invention.
Figure 4:
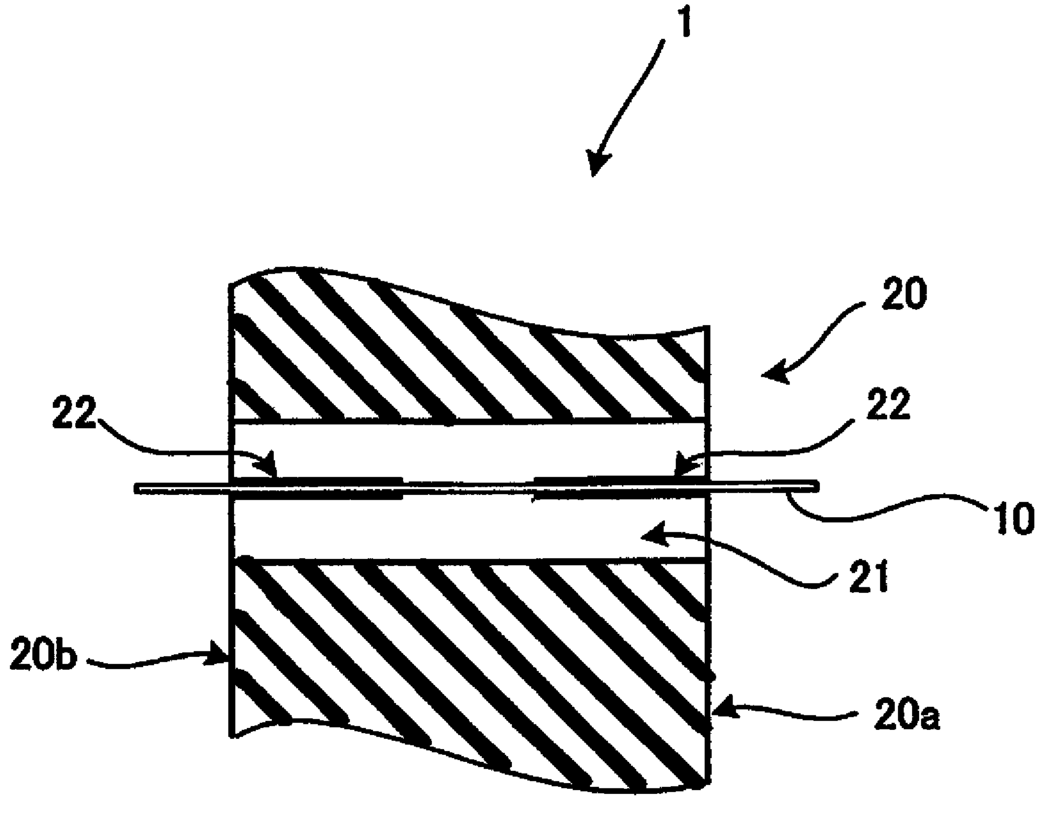
FIG. 4 is a right side view of the interposer according to the first embodiment of the present invention.

FIG. 3 is an enlarged sectional view taken along the line A-A line of FIG. 2. FIG. 4 is an enlarged sectional view taken along the line B-B line of FIG. 2. Incidentally, for the sake of convenience of the explanation, FIG. 3 additionally shows a pad 31 of an circuit board 30 and a semiconductor ball 40.

An interposer 1 is composed of a contact 10 and a housing 20 of an insulator where the contact 10 is mounted.

The contact 10 is provided with a spring section 11 and a pair of contact points 12 (121, 122). The contact 10 corresponds to a first embodiment of the present invention. The contact 10 is for instance one that consists of the Ni alloy, such as Ni—Co and Ni—Mn (for instance, Hv450-Hv600), and is produced using a micro-process technique that combines photolithography and electroforming, which is well known. Therefore, a contact 10 thickness of 50 μm or less is achieved. In the embodiment shown, the thickness is assumed to be about 20 μm. Additionally, the contact 10, prepared from a Ni alloy, is extremely resistant to abrasion and has high durability.

The spring section 11 of the contact 10 is formed as a single closed loop of material, which is prepared from Ni alloy. The loop is capable of being subjected to force at different points, thus causing elastic deformation. The spring section 11, as a result, is approximately gourd-shaped having narrow portions 111 that mutually approach an axis connecting a pair of contact points 12 (121, 122).

A pair of contact points 12 (121, 122) of the contact 10 are formed in such a way that the contact points 121 and 122 project outwardly at positions, separated from one another, each contact point 121, 122 about half way around the loop of the spring section 11. Moreover, each tip of the contact points 12 (121, 122) are formed using a micro-process technique, to prepare a circular arc of radius 30 μm or less. For instance, each tip has a circular arc of about 5 μm in the embodiment shown. Each contact point 121, 122 is capable of contacting an associated terminal. For instance, in the embodiment shown, the contact point 121, 122 contacts a pair of terminals, such as a pad 31 of a circuit board 30 and a semiconductor ball 40.

According to the contact 10 of the first embodiment, when a pair of contact points 12 (121, 122) meet with a terminal, it is possible to achieve high concentrated stress, even in case of a low load, such as low touching pressure. Accordingly, even if contamination (pollutant) or an insulation film form on the surface of the terminal, a pair of contact points 12 (121, 122) may overcome the contamination or insulation film through the high concentrated stress. Thus, it is possible to obtain excellent contact resistance with the terminal. Moreover, the contact 10 of the first embodiment is of a shape, which is different from the shape of a conventional contact where the amount of displacement depends only on a cantilever beam shaped connection section. IN the proposed contact, it is possible to obtain an amount of displacement that is larger than that of the conventional contact without increasing the thickness of the contact 10. Additionally, even in a case where the thickness is 20 μm, for instance, the contact 10 can be produced at lower costs than a conventional contact.

According to the contact 10 of the first embodiment, the spring section 11 is formed as a single closed loop. This feature allows the contact 10 to remain connected when receiving a lateral load, which is different from the conventional contact, wherein two contact points are connected by positioning the contact member in between the two contact points. It is possible to maintain contact 10 structure and function. Moreover, the contact 10 is formed using a micro-process technique, which combines photolithography and electroforming, in such a way that the contact points 12 (121, 122) are very sharply formed, like a circular arc. In the embodiment shown, the contact points (121, 122) have minute radii of 5 μm. In such a design, it is possible to obtain higher concentrated stress, even with low contact pressure. Therefore, according to the contact 10 of the first embodiment, it is possible to provide a contact having high durability and contact reliability.

The contact 10 of the first embodiment is very small, being prepared using the micro process-technique. This makes it possible to achieve high-density mounting between the contact 10 and the housing 20. The design of the narrow portions 111 facilitates this process. Moreover, the use of the very small contact 10 makes it possible to conduct a high-speed signal because the electrical length is shortened.

The housing 20 has a thickness that is thicker than the length of the narrow portions 111, in a direction extending to the contact points. However, the housing 20 is thinner than a distance between the pair of contact points 12 (121, 122). The housing 20 has two or more circular penetration holes 21 and slits 22, each having a space larger than the thickness of the contact 10. The slits 22 each penetrate two or more penetration holes 21, which are formed on a surface 20*a* and extending to a back 20*b* of the housing 20. The slits 22 extend parallel to the surface 20*a* and the back 20*b* of the housing. According to the contact 10 of the embodiment shown, the narrow portions 111 are positioned in a central part of the penetration hole 21. Furthermore, the housing surface 20*a* and back 20*b* are mounted in such a way that the one contact point 121 and the other contact point 122 projected from the associated slits 22 respectively, including the portions which are adjacent to the one contact point 121 and the other contact point 122 of the spring section 11 respectively. The housing 20 has a board support body 23 that supports the mounted contact 10.

Therefore, the interposer 1 of the first embodiment has high durability, and is high in the contact reliability, and is capable high density mounting. Further, the interposer 1 is capable of handling a high-speed signal. According to the interposer 1, the posture of the contact 10, which is mounted on the housing 20, is stabilized by the slit 22.

Next, a second embodiment of the interposer of the present invention will be described.

Incidentally, the following second embodiment is one in which the contact 10, which is a component of the interposer 1 of the first embodiment mentioned above, is replaced with a contact 50 which is shaped differently than the contact 10 of the first embodiment.

In the following figures, the same parts are denoted by the same reference numbers as those of FIGS. 1 to 4. Redundant explanation will be omitted. It explains only the difference point with the first embodiment.

Figure 5:
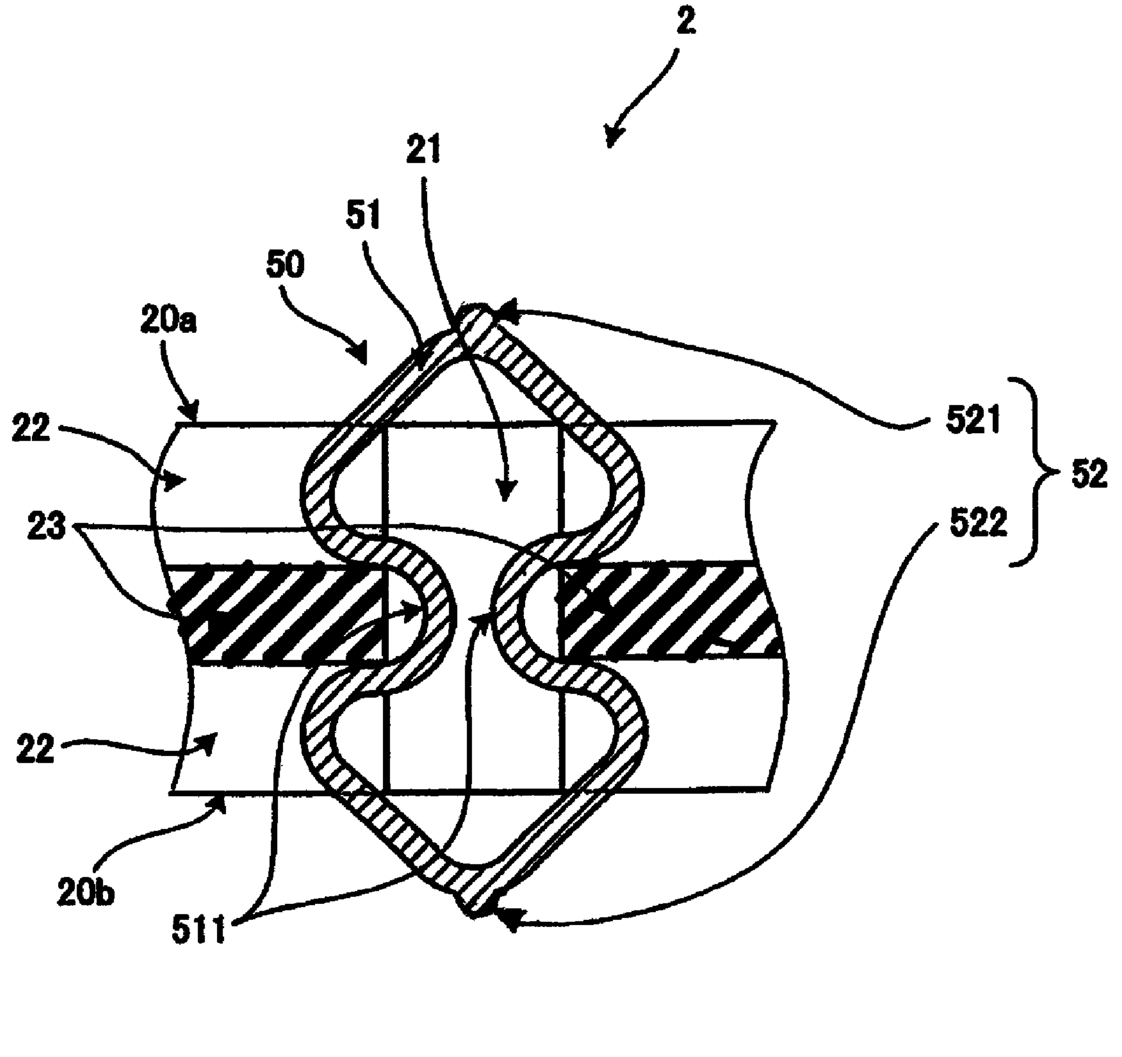
FIG. 5 is an enlarged sectional view of a portion in which a contact is mounted on a housing of an interposer according to a second embodiment of the present invention.

FIG. 5 is an enlarged sectional view of a portion in which the contact 50 is mounted on the housing 20 of the interposer 2, according to the second embodiment of the present invention.

The interposer 2 comprises the contact 50 and the housing 20 of an insulator, where the contact 50 is mounted.

The contact 50 has a spring section 51 and a pair of contacts 52 (521, 522). The contact 50 corresponds to the second embodiment of a contact of the present invention.

The spring section 51 of the contact 50 is formed as a single closed loop of material, which is prepared from Ni alloy. The loop may be subjected to force, which causes elastic deformation. Moreover, the spring 51 is substantially gourd-shaped having narrow portions 511, which are narrowed in the direction that mutually approach an axis drawn between a pair of contact points 52 (521, 522), wherein an upper portion and a lower portion of the loop each have an arrow shape.

A pair of contact points 52 (521, 522) of the contact 50 are formed in such a way that the contact points 521 and 522 project outwardly at positions, separated from one another, each contact point 521, 522 about half around of the loop of the spring section 51. The pair of contacts 52 (521, 522) are capable of meeting with an associated terminal.

The interposer 2 of the second embodiment, in which the substantially gourd-shaped contact 50 is mounted, and designed in much the same way as the interposer 1 of the first embodiment, has high durability and contact reliability. Further, the interposer 2 is capable of high density mounting, and handling a high-speed signal.

Next, there will be explained a third embodiment of the interposer of the present invention.

Incidentally, the following third embodiment is one in which the contact 10, which is the component of the interposer 1 of the first embodiment mentioned above, is replaced with a contact 60, which is different in shape from the contact 10 of the first embodiment.

In the following figures, the same parts are denoted by the same reference numbers as those of FIGS. 1 to 4. Redundant explanation will be omitted. It explains only the difference point with the first embodiment.

Figure 6:
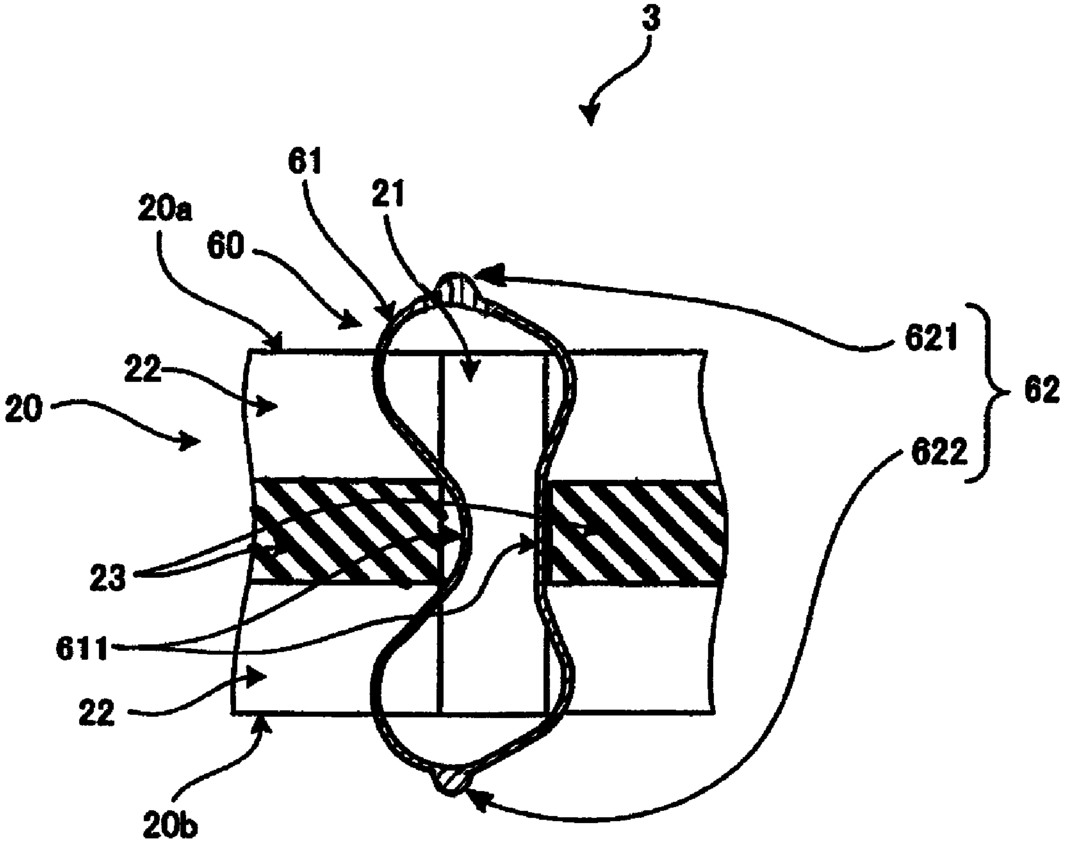
FIG. 6 is an enlarged sectional view of a portion in which a contact is mounted on a housing of an interposer according to a third embodiment of the present invention.

FIG. 6 is an enlarged sectional view of a portion in which a contact 60 is mounted on the housing 20 of an interposer 3 according to a third embodiment of the present invention.

The interposer 3 comprises the contact 60 and the housing 20 of an insulator, where the contact 60 is mounted.

The contact 60 has a spring section 61 and a pair of contacts points 62 (621, 622). The contact 60 corresponds to the third embodiment of the present invention.

The spring section 61 of the contact 60 is formed as a single closed loop of material, which is also prepared from Ni alloy. The loop may be subjected to force at different points, causing elastic deformation. Moreover, the spring section 61 is gourd-shaped, having narrow portions 611 that are narrowed in a direction that mutually approach at an axis drawn between a pair of contact points 62 (621, 622). The loop shape of spring section 61, while divided into two by an axis that connects a pair of contact points 62 (621, 622), is a non-symmetric shape.

A pair of contact points 62 (621, 622) of the contact 60 are formed in such a manner that the contacts 621 and 622 project outwardly at positions separated from one another, each contact point 621, 622 positioned about half way around the loop of the spring section 61. The pair of contacts 62 (621, 622) are capable of meeting with an associated terminal.

According to the interposer 3 of the third embodiment, wherein the loop shape of the spring section is non-symmetric shape, one side and the other side of the spring section 61 are distorted and transformed when a pair of contact points 62 (621, 622) meets and comes in contact with the associated terminal. As a result, a pair of contact points 62 (621, 622) move in a horizontal direction to meet the terminal, so that wiping action is established. Thus, according to the interposer 3 of the third embodiment, even if contamination (pollutant) or an insulation film is formed on the surface of the terminal, the pair of contact points 62 (621, 622) overcome the contamination or insulation film by the wiping action. Hence, the design improves contact resistance with the terminal, as well as contact reliability. The interposer 3 of the third embodiment, similar to the interposer 1 of the first embodiment, has high durability, and is capable of high density mounting. Further, the interposer 3 is capable of handling a high-speed signal.

Next, there will be explained a fourth embodiment of the interposer of the present invention.

Incidentally, the following fourth embodiment is one in which the contact 10, which is the component of the interposer 1 of the first embodiment mentioned above, is replaced with a contact 70 that is shaped differently than the contact 10 described in the first embodiment.

In the following figures, the same parts are denoted by the same reference numbers as those of FIGS. 1 to 4. Redundant explanation will be omitted. It explains only the difference point with the first embodiment.

Figure 7:
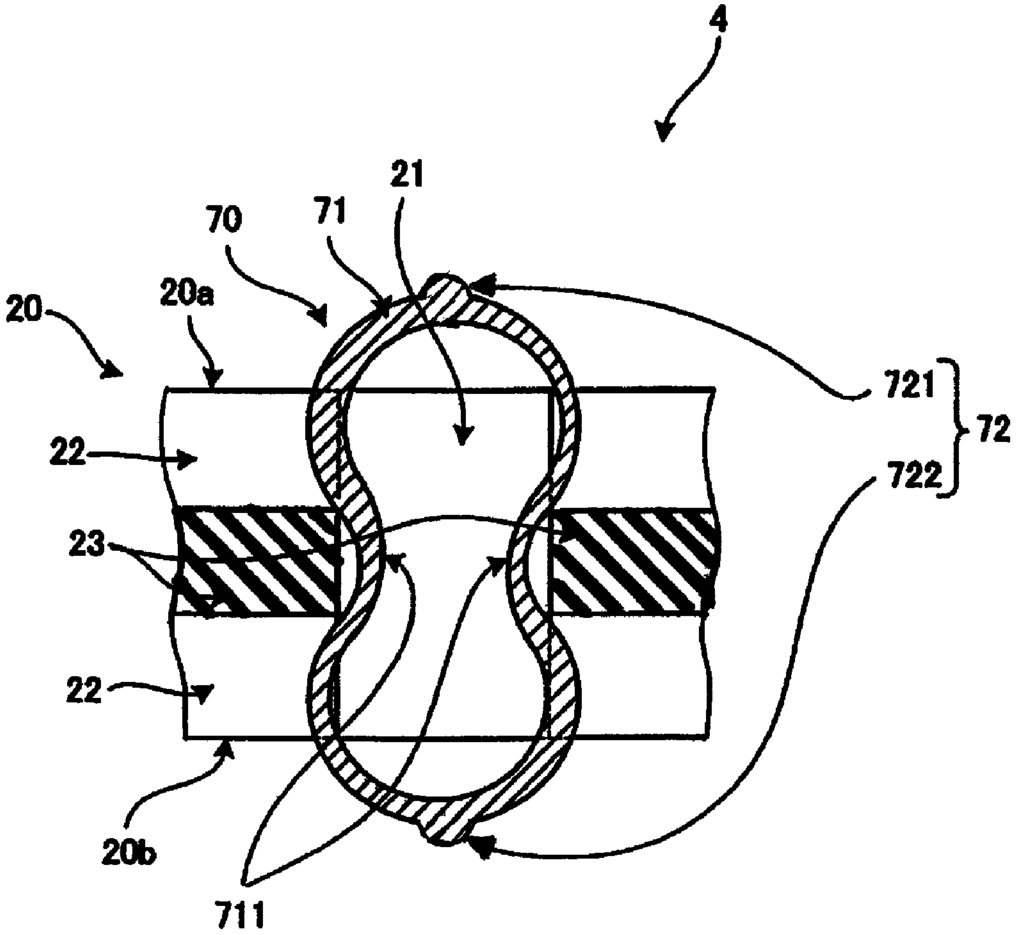
FIG. 7 is an enlarged sectional view of a portion in which a contact is mounted on a housing of an interposer according to a fourth embodiment of the present invention.

FIG. 7 is an enlarged sectional view of a portion in which the contact 70 is mounted on the housing 20 of the interposer 4, according to a fourth embodiment of the present invention.

The interposer 4 comprises the contact 70 and the housing 20 of an insulator where the contact 70 is mounted.

The contact 70 has a spring section 71 and a pair of contact points 72 (721, 722). The contact 70 corresponds to the fourth embodiment of the present invention.

The spring section 71 of the contact 70 is formed as a single closed loop of material, which is prepared from Ni alloy. The loop may be subjected to force at different points, causing elastic deformation. Moreover, the spring section 71 is a gourd-shaped, having narrow portions 711 that are narrowed in a direction that mutually approach an axis drawn between a pair of contact points 72 (721, 722). The loop shape of spring section 71, when divided into two by an axis connecting a pair of contact points 72 (721, 722), creates sectional shapes that are mutually different.

The pair of contact points 72 (721, 722) of the contact 70 are formed in such a way that the contact points 721 and 722 project outwardly at positions separated from one another, each contact point 721, 722 about half way around the loop of the spring section 71. The pair of contacts 72 (721, 722) are capable of meeting with an associated terminal.

According to the interposer 4 of the fourth embodiment, the loop shape of the spring section is non-symmetric shape, wherein one side and the other side of the spring section 71 are distorted and transformed when a pair of contact points 72 (721, 722) meets and comes into contact with the associated terminal. Similar to the interposer 3 of the third embodiment, one side and the other side of the spring section 71 are distorted and transformed when a pair of contacts 72 (721, 722) meet with an associated terminal. As a result, a pair of contact points 72 (721, 722) moves in the horizontal direction in order to meet with the terminal, so that wiping action is established. Thus, according to the interposer 4 of the fourth embodiment, even if contamination (pollutant) or an insulation film is formed on the surface of the terminal, the pair of contact points 72 (721, 722) overcome the contamination or insulation film by wiping action, thus improving contact resistance with the terminal. As a result, the contact 70 is extremely high in contact reliability. The interposer 4 of the fourth embodiment, similar to the interposer 1 of the first embodiment, has high durability, and is capable of high density mounting. Further, the interposer 4, according to the fourth embodiment, is capable of handling a high-speed signal.

Next, there will be explained a fifth embodiment of the present invention.

Incidentally, the following fifth embodiment is one in which the contact 10 and the housing 20, that are components of the interposer 1 of the first embodiment mentioned above, are replaced respectively with a contact 80 and a housing 210 that are different from the contact 80 and the housing 210 in the shape.

Figure 8:
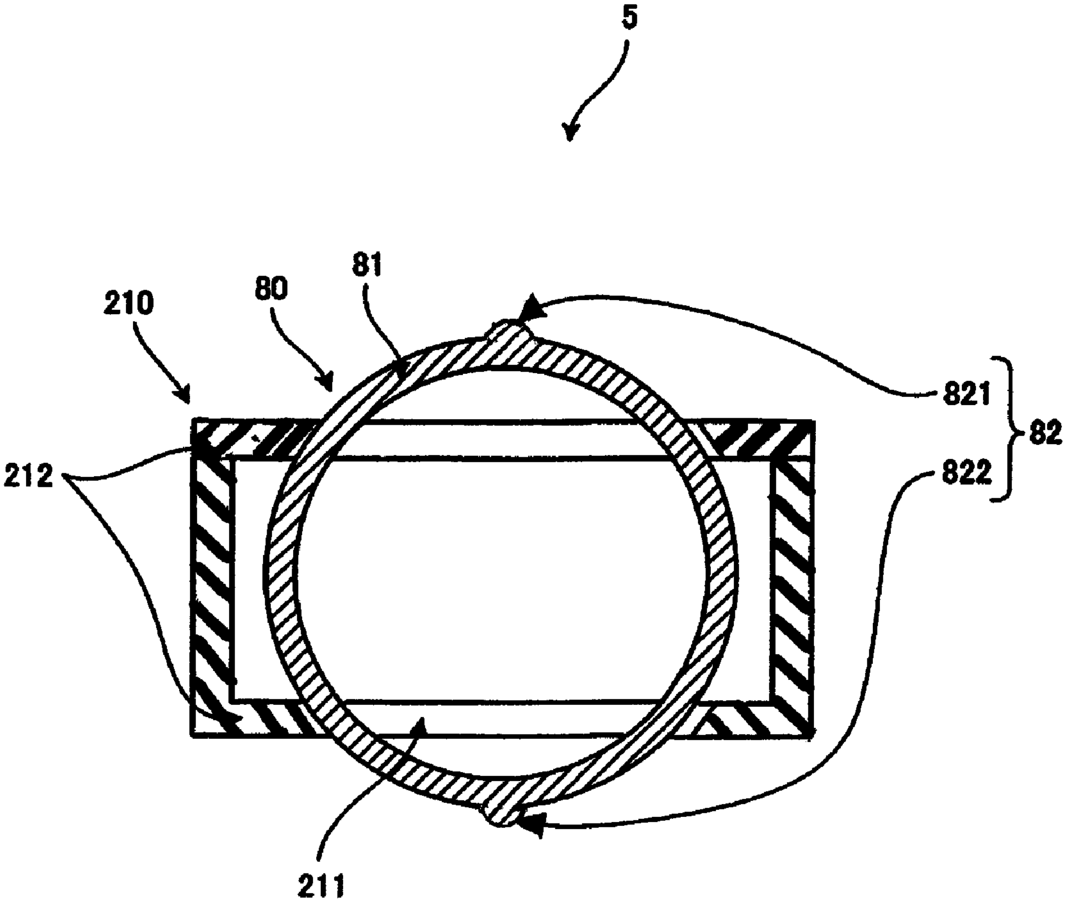
FIG. 8 is an enlarged sectional view of a portion in which a contact is mounted on a housing of an interposer according to a fifth embodiment of the present invention.

FIG. 8 is an enlarged sectional view of a portion in which the contact 80 is mounted on the housing 210 of an interposer 5, according to a fifth embodiment of the present invention.

The interposer 5 comprises the contact 80 and the housing 210 of an insulator, where the contact 80 is mounted.

The contact 80 has a spring section 81 and a pair of contact points 82 (821, 822). The contact 80 corresponds to the fifth embodiment of the present invention.

The spring section 81 of the contact 80 is formed as a single closed loop of material, which is prepared from Ni alloy. The loop is round shaped, yet capable of elastic deformation through force.

A pair of contact points 82 (821, 822) of the contact 80 are formed in such a way that the contact points 821 and 822 project outwardly at positions separated from one another, each contact point 821, 822 about half way around the loop of the spring section 81. The pair of contact points 82 (821, 822) are capable of meeting with an associated terminal.

The housing 210 has thickness that is thinner than the distance between the pair of contact points 82 (821, 822). The housing 210 has a pair of plate members 212 that include formed slits 211, which cause one contact point 821 and the other contact point 822 to project through the plate member 212, respectively. According to the contact 80, the one contact point 821 and the other contact point 822 enter the slits 211, and the contact 80 is mounted in such a manner that the one contact point 821 and the other contact point 822 projected from the associated slits 211, respectively, including the portions which are adjacent to the one contact 821 and the other contact 822 of the spring section 81, respectively.

The interposer 5 of the fifth embodiment, in which the round contact 80 is mounted, is similar to the interposer 1 of the first embodiment, in that the interposer 5 has high durability and contact reliability, and is capable of high density mounting. Additionally, the interposer 5 of the fifth embodiment is capable of handling a high-speed signal.

Next, there will be explained a sixth embodiment of the interposer of the present invention.

Incidentally, the following sixth embodiment is one in which the contact 10 and the housing 20, that are the components of the interposer 1 of the first embodiment mentioned above, are replaced with a contact 90 and a housing 220 that are different from the contact 10 and the housing 20 in shape.

Figure 9:
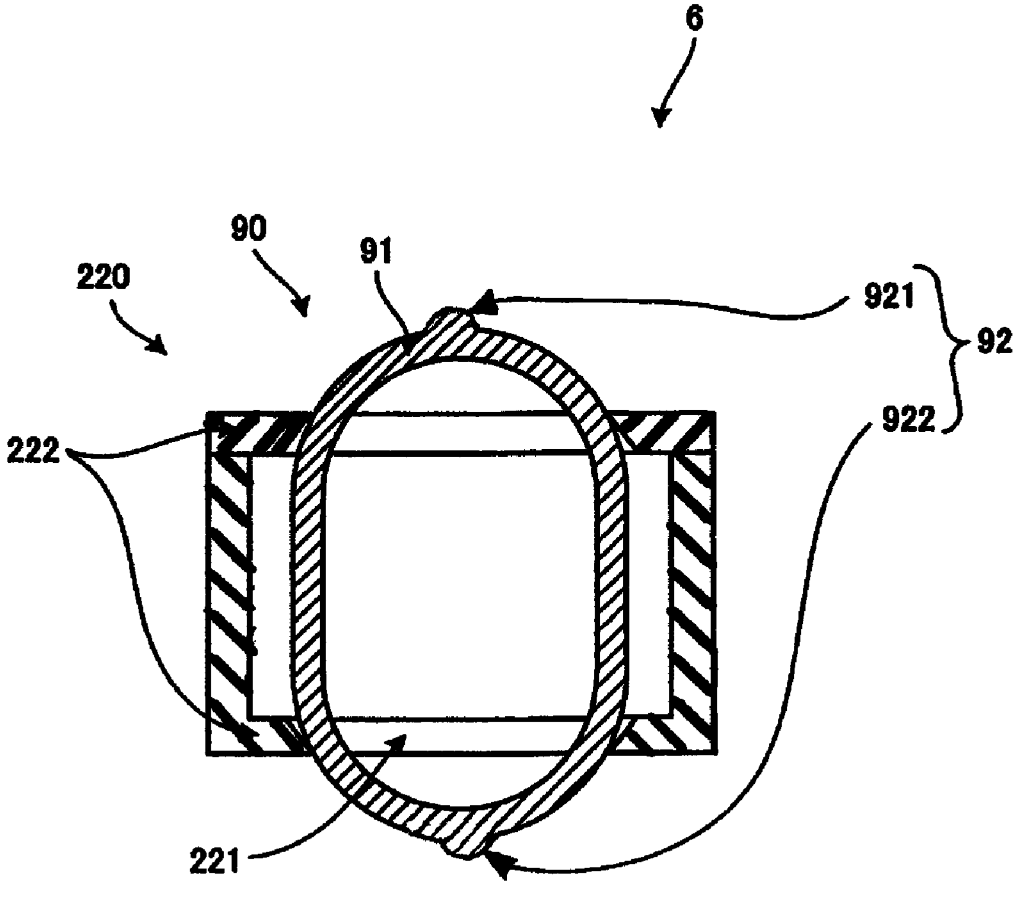
FIG. 9 is an enlarged sectional view of a portion in which a contact is mounted on a housing of an interposer according to a sixth embodiment of the present invention.

FIG. 9 is an enlarged sectional view of a portion in which the contact 90 is mounted on the housing 220 of an interposer 6, according to the sixth embodiment of the present invention.

The interposer 6 comprises the contact 90 and the housing 220 of an insulator where the contact 90 is mounted.

The contact 90 has a spring section 91 and a pair of contact points 92 (921, 922). The contact 90 corresponds to the sixth embodiment of the present invention.

The spring section 91 of the contact 90 is formed is formed as a round single closed loop, which may be subjected to force in order to cause elastic deformation.

A pair of contact points 92 (921, 922) of the contact 90 are formed in such a way that the contact points 921 and 922 project outwardly at positions separated from one another, each contact point 921, 922 about half way around the loop of the spring section 91. The pair of contact points 92 (921, 922) capable of meeting with an associated terminal.

The housing 220 has a thickness that is thinner than the distance between the pair of contact points 92 (921, 922). The housing 220 has a pair of plate members 222 having formed slits 221, which cause one contact point 921 and the other contact point 922 to project through the plate members 222, respectively. According to the contact 90, the one contact point 921 and the other contact point 922 enter the slits 221, and the contact 90 is mounted in such a way that the one contact point 921 and the other contact point 922 project through the associated slits 221, respectively, including the portions which are adjacent to the one contact point 921 and the other contact point 922 of the spring section 91, respectively.

The interposer 6 of the sixth embodiment, in which the substantially round contact 90 is mounted, and similar to the interposer 1 of the first embodiment, has high durability and contact reliability, and is capable of high density mounting. Further, the interposer 6 of the sixth embodiment is capable of handling a high-speed signal.

Next, there will be explained a seventh embodiment of the interposer of the present invention.

Incidentally, the following seventh embodiment is one in which the housing 20, that is the component of the interposer 1 of the first embodiment mentioned above, is replaced with a housing 220 which is different from the housing 20 in the shape.

In the following figures, the same parts are denoted by the same reference numbers as those of FIGS. 1 to 4. Redundant explanation will be omitted. It explains only the difference point with the first embodiment.

Figure 10:
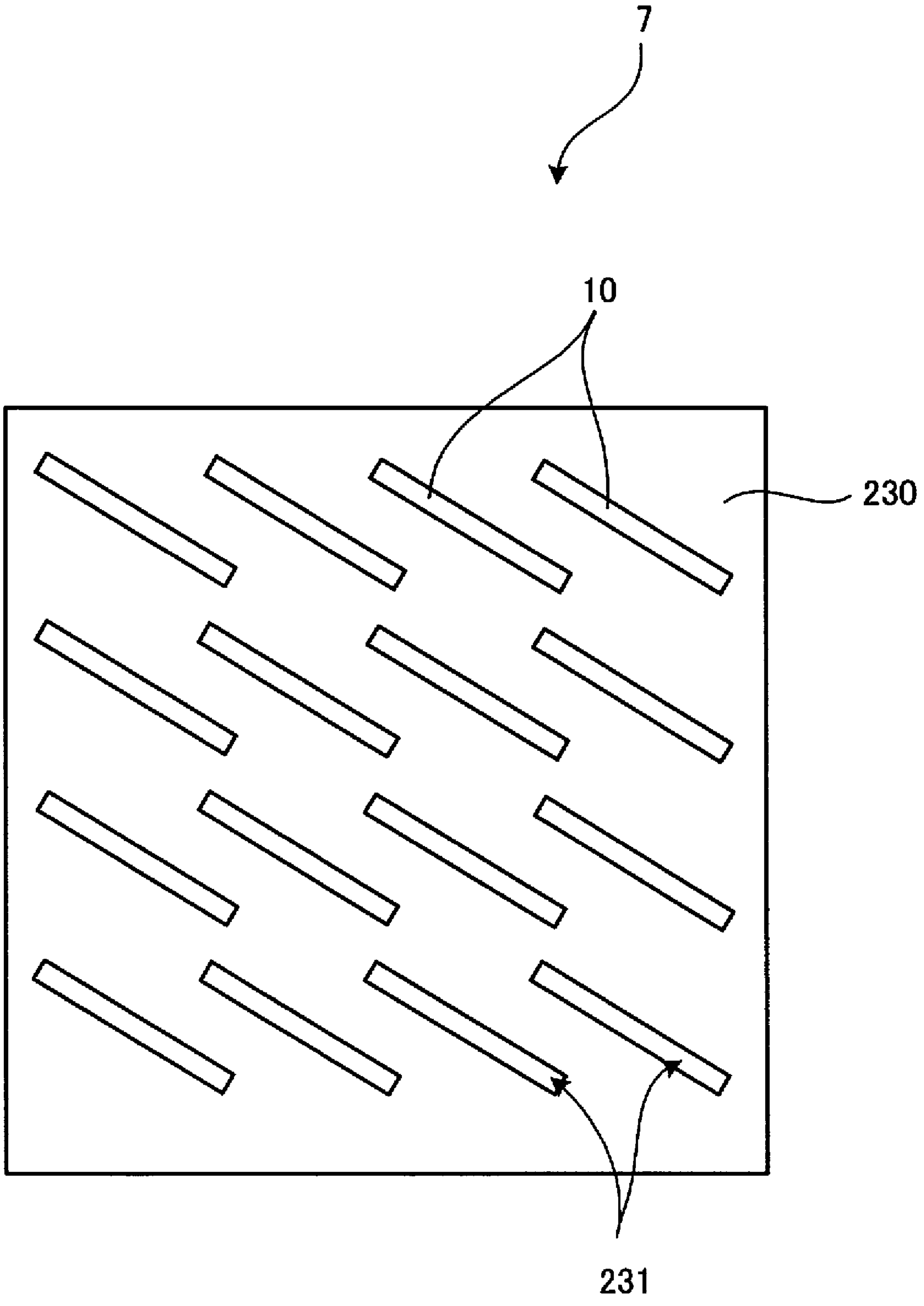
FIG. 10 is a plan view of the interposer according to a seventh embodiment of the present invention.

FIG. 10 is a plan view of the interposer 7, according to a seventh embodiment of the present invention.

The interposer 7 comprises the contact 10 and the housing 230 of an insulator where the contact 10 is mounted.

The housing 230 has thickness that is thicker than the narrow portions 111, but is thinner than the distance between a pair of contact points 12 (121, 122). The housing 230 has a rectangular parallelepiped shape. Two or more contacts 10 are arranged on a two-dimensional basis. Slits 231 are prepared within the housing 230, so that the slits 231 diagonally extend toward a side of the rectangular shape of the housing 230, as shown by a plane view of FIG. 10.

The interposer 7, similar to the interposer 1 of the first embodiment, has high durability and is capable of high density mounting, as well as the ability to handle a high-speed signal.

The contacts, according to the embodiments as mentioned above, can be applied also to a test socket of a semiconductor testing device and a connection between high density substrates beside the interposer.

Moreover, the interposer, according to the embodiments as mentioned above, can be prepared through high density mounting for use in ultrasonic diagnostic equipment for medical treatment, such as CT, MRI, and NMR equipment, as well as devices for probing tests that measures an electric characteristic.

The interposers of the first through fourth embodiments are explained by way of example enumerating such a case where the housing has two or more penetration holes and slits. However, it is possible that the housing, referred to in the present invention, may have a board support body that has thickness corresponding to the length of the narrow portions of the contact, and has a penetration hole that the narrow portion enters.

As mentioned above, and according to the present invention, it is possible to provide a contact wherein the contact has high durability and contact reliability, and is further capable of high density mounting and handling of a high-speed signal.

While the present invention has been described with reference to the particular illustrative embodiments, it is not to be restricted by those embodiments but only by the appended claims. It is to be appreciated that those skilled in the art can change or modify the embodiments without departing from the scope and sprit of the present invention.

What is claimed is:

1. An interposer comprising:

a contact having a spring section that has a non-symmetric shape and is formed as a single closed loop material capable of elastic deformation, and a pair of contact points that are formed as circular arcs and project outwardly from a surface of a single closed loop, separated from one another, each contact point positioned about half way around the loop of the spring section, the pair of contact points each positioned to contact a mating terminal, wherein the spring section has narrow portions that are narrowed in a direction that mutually approaches an axis between the pair of contact points; and a housing that has thickness corresponding to a size, in a direction where a pair of contact points are connected, and has a board support body having a penetration hole in which the narrow portions enter;

wherein the housing has upper and lower spaces above and below the board support body for allowing the spring portion to bulge laterally; and wherein the contact has a thickness of about 50 μm or less.

2. An interposer comprising:

a contact having a spring section that has a non-symmetric shape and is formed as a single closed loop material capable of elastic deformation, and a pair of contact points that are formed as circular arcs and project outwardly from a surface of a single closed loop, separated from one another, each contact point positioned about half way around the loop of the spring section, the pair of contact points each positioned to contact a mating terminal, wherein the spring section has narrow portions that are narrowed in a direction that mutually approaches an axis drawn between the pair of contact points; and a housing having a thickness that is thicker than a length of the narrow portions and is thinner than a distance between the pair of contacts, the housing having a board support body, upper and lower spaces above and below the board support body for allowing the spring portion to bulge laterally, penetration holes and slits;

wherein the penetration holes and slits penetrate on a surface and a back of the housing respectively in parallel to the surface and the back;

wherein the narrow portions enter a central part of the penetration hole, and the surface and the back are mounted in such a manner that one contact point and other contact point project from the associated slits respectively, including portions which are adjacent to the one contact point and the other contact point of the spring section respectively;

wherein the contact has a thickness of about 50 μm or less.

3. The interposer according to claim 2, wherein the housing has a rectangular shape, and the slits diagonally extend to a side of the rectangular shape of the housing.

* * * * *